(12) United States Patent
Yamazaki et al.

(10) Patent No.: US 6,261,877 B1
(45) Date of Patent: *Jul. 17, 2001

(54) METHOD OF MANUFACTURING GATE INSULATED FIELD EFFECT TRANSISTORS

(75) Inventors: Shunpei Yamazaki, Tokyo; Hongyong Zhang, Yamato; Takashi Inushima, Atsugi; Takeshi Fukada, Ebina, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/677,331

(22) Filed: Jul. 2, 1996

Related U.S. Application Data

(62) Division of application No. 08/310,364, filed on Sep. 22, 1994, which is a continuation of application No. 07/673,417, filed on Mar. 22, 1991, now abandoned.

(30) Foreign Application Priority Data

Sep. 11, 1990 (JP) .................................................... 2-305528
Sep. 11, 1990 (JP) .................................................... 2-305529

(51) Int. Cl.[7] .................................................... H01L 21/84
(52) U.S. Cl. ........................ 438/151; 438/906; 438/907; 438/908
(58) Field of Search ........................ 437/21, 41, 946; 204/192.22, 192.23; 438/151, 906, 908, 909, 907

(56) References Cited

U.S. PATENT DOCUMENTS 3,616,403    10/1971  Collins et al. .
3,878,549    4/1975   Yamazaki .................................. 437/81
4,217,374    8/1980   Ovshinsky et al. ............. 204/192.25

(List continued on next page.)

FOREIGN PATENT DOCUMENTS 0449404      1/1991   (EP) .
53-27483     3/1978   (JP) .
55-050664    4/1980   (JP) .

(List continued on next page.)

OTHER PUBLICATIONS

Wolf et al., "Silicon Processing for the VLSI Era vol. 1: Process Technology", pp. 516–520, Lattice Press, 1986.*

Masumo et al., "Low Temperature Polysilicon TFT's by Non–Mass–Separated Ion Flux Doping Technique", 1990, pp. 975–978, Extended Abstracts of the 22nd (1990 International) Conference on Solid State Devices and Materials, Sendai.

(List continued on next page.)

Primary Examiner—Richard Booth
(74) Attorney, Agent, or Firm—Eric J. Robinson; Nixon Peabody LLP

(57) ABSTRACT

A method of manufacturing thin film field effect transistors is described. The channel region of the transistors is formed by depositing an amorphous semiconductor film in a first sputtering apparatus followed by thermal treatment for converting the amorphous phase to a polycrystalline phase. The gate insulating film is formed by depositing an oxide film in a second sputtering apparatus connected to the first apparatus through a gate valve. The sputtering for the deposition of the amorphous semiconductor film is carried out in an atmosphere comprising hydrogen in order to introduce hydrogen into the amorphous semiconductor film. On the other hand the gate insulating oxide film is deposited by sputtering in an atmosphere comprising oxygen.

28 Claims, 10 Drawing Sheets

U.S. PATENT DOCUMENTS

| | | | |
|---|---|---|---|
| 4,288,256 | 9/1981 | Ning et al. | 437/41 |
| 4,335,161 | 6/1982 | Luo . | |
| 4,345,248 | 8/1982 | Togashi et al. | 340/765 |
| 4,379,020 | 4/1983 | Glaeser et al. | 117/8 |
| 4,400,256 | 8/1983 | Riley | 204/192.25 |
| 4,438,723 | 3/1984 | Cannella et al. | 437/101 |
| 4,445,134 | 4/1984 | Miller | 357/65 |
| 4,468,853 | 9/1984 | Morita et al. | 437/2 |
| 4,492,716 | 1/1985 | Yamazaki . | |
| 4,505,950 | 3/1985 | Yamazaki . | |
| 4,508,609 | 4/1985 | Moustakas et al. . | |
| 4,528,082 | 7/1985 | Moustakas et al. | 204/192.25 |
| 4,619,034 | 10/1986 | Janning . | |
| 4,727,044 | 2/1988 | Yamazaki | 437/45 |
| 4,732,659 | 3/1988 | Schachter et al. | 204/192.25 |
| 4,769,338 | 9/1988 | Ovshinsky et al. | 437/49 |
| 4,772,927 | 9/1988 | Saito et al. . | |
| 4,777,150 | 10/1988 | Deneuville et al. | 437/200 |
| 4,800,174 | 1/1989 | Ishihara et al. . | |
| 4,808,553 | 2/1989 | Yamazaki | 437/100 |
| 4,808,554 | 2/1989 | Yamazaki | 437/101 |
| 4,814,292 | 3/1989 | Sasaki et al. . | |
| 4,900,646 | 2/1990 | Senske et al. | 430/128 |
| 4,940,523 | 7/1990 | Takeshima . | |
| 4,951,601 | 8/1990 | Maydar et al. | 204/295.25 |
| 4,987,008 | 1/1991 | Yamazaki et al. . | |
| 4,988,642 | 1/1991 | Yamazaki | 437/81 |
| 4,996,077 * | 2/1991 | Moslehi et al. | 427/38 |
| 5,034,340 | 7/1991 | Tanaka et al. | 437/41 |
| 5,047,360 | 9/1991 | Nicholas | 437/21 |
| 5,049,523 | 9/1991 | Coleman | 437/101 |
| 5,132,754 | 7/1992 | Serikawa et al. . | |
| 5,141,885 | 8/1992 | Yoshida et al. . | |
| 5,166,085 | 11/1992 | Wakai et al. | 437/40 |
| 5,210,050 | 5/1993 | Yamazaki et al. . | |
| 5,248,630 | 9/1993 | Serikawa et al. . | |
| 5,278,093 | 1/1994 | Yonehara . | |
| 5,420,048 | 5/1995 | Kondo . | |
| 5,470,799 * | 11/1995 | Itoh et al. . | |
| 5,543,636 | 8/1996 | Yamazaki . | |
| 5,753,542 | 5/1998 | Yamazaki et al. . | |
| 5,780,313 | 7/1998 | Yamazaki . | |

FOREIGN PATENT DOCUMENTS

| | | |
|---|---|---|
| 55-105332 | 8/1980 | (JP) . |
| 56-123377 | 9/1981 | (JP) . |
| 56-135968 | 10/1981 | (JP) . |
| 57-104260 | 6/1982 | (JP) . |
| 58-170064 | 10/1983 | (JP) . |
| 58-196063 | 11/1983 | (JP) . |
| 60-057975 | 4/1985 | (JP) . |
| 60-238479 | 11/1985 | (JP) . |
| 60-257172 | 12/1985 | (JP) . |
| 62-30379 | 2/1987 | (JP) . |
| 62-63475 | 3/1987 | (JP) . |
| 62-104171 | 5/1987 | (JP) . |
| 62-95860 | 5/1987 | (JP) . |
| 62-202078 | 9/1987 | (JP) . |
| 62-21128 | 11/1987 | (JP) . |
| 62-26118 | 11/1987 | (JP) . |
| 63-156325 | 6/1988 | (JP) . |
| 63-168052 | 12/1988 | (JP) . |
| 01031466 | 2/1989 | (JP) . |
| 64-31967 | 2/1989 | (JP) . |
| 64-35959 | 2/1989 | (JP) . |
| 8980639 | 2/1989 | (JP) . |
| 1-103825 | 4/1989 | (JP) . |
| 1-179365 | 5/1989 | (JP) . |
| 1-184928 | 7/1989 | (JP) . |
| 1-209764 | 8/1989 | (JP) . |
| 89-12909 | 12/1989 | (JP) ..... 437/43 |
| 2-082578 | 3/1990 | (JP) . |
| 2-090568 | 3/1990 | (JP) . |
| 2-130932 | 5/1990 | (JP) . |
| 2-177443 | 7/1990 | (JP) . |
| 2-194620 | 8/1990 | (JP) . |
| 2-222547 | 9/1990 | (JP) . |
| 2-239615 | 9/1990 | (JP) . |

OTHER PUBLICATIONS

Serikawa et al., "Low–Temperature Fabrication of High–Mobility Poly–Si TFT's for Large–Area LCD's", Sep. 1989, pp. 1929, IEEE Transactions on Electron Devices, vol. 36, No. 9.

English Translation, "Raman Analysis, Raman Spectrometry", 1964, pp. 553, Enclyclopaedia Chimica.

Tonouchi et al., "Characterization of . . . Si:H Films Prepared by H2 Sputtering", Feb. 8, 1990, pp. L385–L387, J. Journal of Appl. Physics.

Sun et al., "Growth Temperature Dependence of . . . Si:H Films Sputtered with Hydrogen Gas", Jul. 1990, pp. L1029–L1032, J. Journal of Appl. Physics, vol. 29, No. 7.

Thomas et al., "CW Laser Annealing of Hydrogenated Amorphous Silicon Obtained by RF Sputtering", Jan. 1981, pp. 476–479, J. Appl Phys. 52(1), American Institute of Physics.

Serikawa et al., "Low–Temperature Fabrication of High–Mobility Poly–Si TFT's for Large–Area LCD's" IEEE Transactions on Electron Devices, vol. 35, No. 9, Sep. 1989, p. 1929.

Proceedings of the SID, vol. 30, No. 2, 1989, pp. 137–141, Tadashi Serikawa et al. Low–temperature fabrication of high–mobility Poly–Si TFT's for large–area LCD's, month unknown.

IEEE Transactions on Electronic Devices, vol. ED–34, No. 10, Oct. 1987, pp. 2124–2128, Shiro Suyama et al. "Electrical characteristics of MOSFET's utilizing oxygen–argon sputter–deposited gate oxide films".

Thin Solid Films, vol. 175, No. 1, Aug. 1989, Luasanne CH, pp. 37–42, A. Kolodziej et al. "Characteristics of hydrogenated amorphous silicon thin film transistors fabricated by D.C. magnetron sputtering".

Suyama et al., "Electrical conduction mechanism and breakdown property in sputter deposited silicon dioxide films on polycrystalline silicon", J. APP Physics, vol. 65, No. 1, Jan. 1989, pp. 210–214.

Stein et al.,, "Properties of Magnetron Sputtered Hydrogenated Amorphous Silicon", J. of Electronic Materials, vol. 10, No. 4, Jul. 1981, pp. 797–810.

Haberle et al. "Electrical Properties and Structure of Boron Doped Sputter–Deposited Polycrystalline Silicon Film" Thin Solid Films, 61, 1979, p. 105–113, month unknown.

* cited by examiner

METHOD OF MANUFACTURING GATE INSULATED FIELD EFFECT TRANSISTORS

This is a Divisional application of Ser. No. 08/310,364, filed Sep. 22, 1994, which itself is a continuation of Ser. No. 07/673,417, filed Mar. 22, 1991, now abandoned.

BACKGROUND OF THE INVENTION

1. Field of the Invention

The present invention relates to a method of manufacturing semiconductor devices and, more particularly to a method of manufacturing thin film gate insulated field effect transistors consisting of polycrystalline semiconductor films.

2. Description of the Prior Art

The prior art includes methods utilizing low pressure CVD by which polycrystalline semiconductor thin films are deposited at temperatures ranging from 550° C. to 900° C. Recently, along with development of liquid crystal panels having wide display area, there have been needs for the deposition technique to coat polycrystalline semiconductor films over with areas of substrates.

Polycrystalline films are formed by depositing amorphous semiconductor films by low pressure CVD and then recrystallizing the amorphous films since direct deposition of polycrystalline films on wide areas is difficult for the reason of reaction temperature. On the other hand, it is very difficult to deposit uniform semiconductor films by low pressure CVD. This is the problem also in the case of plasma CVD which, requires longer deposition times.

Sputtering on the other hand is excellent in this sense. Particularly, there are following advantages when films are deposited by magnetron sputtering.

1) The surfaces of substrates are less damaged by high energy electrons since the electrons are confined in the vicinity of the target.

2) Wide areas can be coated at lower temperatures.

3) No dangerous gas is used so that safety process and practicability are ensured.

The sputtering is carried out without hydrogen doping because the electric characteristics of hydrogenated amorphous semiconductors deposited by sputtering are not so good as to satisfy requirements of channel formation for transistors. The semiconductor films deposited by the sputtering, however, have a disadvantage that thermal crystallization thereof is very difficult.

BRIEF SUMMARY OF THE INVENTION

It is an object of the present invention to provide a method of manufacturing gate insulated field effect transistors consisting of polycrystalline semiconductor films in which barrier heights of grain boundaries are substantially decreased.

It is another object of the present invention to provide a method of manufacturing gate insulated field effect transistors consisting of polycrystalline semiconductor films over a wide area of a substrate.

It is a further object of the present invention to provide a method of manufacturing gate insulated field effect transistors consisting of polycrystalline semiconductor films which are so dense as not to easily form natural oxide within the films.

If is a still further object of the present invention to provide a method of manufacturing gate insulated field effect transistors consisting of polycrystalline semiconductor films which possess lattice distortion.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve to foregoing and other object, and in accordance with the present invention, as embodied and broadly described herein, a semiconductor film to form a channel is deposited on a substrate by sputtering in an atmosphere comprising hydrogen whereas an oxide film to form a gate insulating film is deposited by sputtering in an atmosphere comprising oxygen. The semiconductor film and the oxide film are deposited on the substrate one after the other in separate sputtering apparatuses in order to prevent oxygen from leakage into the apparatus for deposition of the semiconductor film from the other apparatus for deposition of the oxide film and vice versa. Irrespective of which film is first deposited and the other next, the density of oxygen atoms occurring in the semiconductor film is limited to no higher than $7 \times 10^{19} cm^{-3}$, preferably no higher than $1 \times 10^{19} cm^{-3}$.

In order to obtain a gate insulated field effect transistor having high performance two or more kinds of layers constituting the transistor may be deposited by sputtering in individual sputtering apparatuses. Two or more of the sputtering apparatuses may be connected so that transportation of a substrate of the transistor can be performed without exposing the substrate and layers formed thereon to the air. For example, gate valves or subsidiary chambers may be provided between the sputtering apparatuses. In the case where the sputtering apparatuses are arranged in series, a gate insulated field effect transistor can be formed on an assembly line by the use of such apparatuses so that productivity thereof can be made high. Two or more kinds of layers constituting the transistor may be formed on an assembly line by sputtering in sputtering apparatuses arranged in series.

In accordance with a preferred embodiment of the present invention, the semiconductor film is first deposited in an amorphous phase or an equivalent phase. The amorphous semiconductor is then given thermal treatment at 450° C. to 700° C. typically at 600° C. in order to convert the amorphous phase to a polycrystalline phase at lease in the channel region. In stead of the thermal treatment, the amorphous semiconductor may be radiated with a beam emitted from a light source, for example a laser or a halogen lamp in order to convert the amorphous phase to a polycrystalline phase at lease in the channel region. This recrystallization easily takes place as compared to the conventional case without the use of hydrogen introduction as explained supra. This is considered because of the following reason. In the conventional case, amorphous semiconductors such as a −Si are deposited to form a certain type of microstructure in which distribution of silicon atoms is uneven. This microstructure hinders the progress of recrystallization during thermal treatment or radiation of a beam emitted from a light source. The inventors have been confirmed that the formation of the microstructure is prevented By introducing hydrogen into the semiconductor film which can be easily recrystallized by thermal treatment or radiation of a beam emitted from a light source. The average diameter of polycrystals formed after the thermal treatment or radiation of a beam emitted from a light source is of the order of 5 Å to 400 Å, typically 50 Å to 200 Å. Such small size of grains in the polycrystals is particularly effective to prevent reverse current leakage across $N^+$-I and $P^+$-I junctions. The proportion of hydrogen introduced into the film is no higher than 5 atom %. An important feature of the semiconductor film is lattice distortion which enables close connection between polycrystals at interfaces thereof. This feature helps to lessen discontinuity at the interfaces and hinder the formation of barriers at the interfaces while, in the case without such lattice distortion, impurity atoms such as oxygen tent to be collected at the interfaces and form crystal barriers which hinder transportation of carriers. In addition to this, since the oxygen density in the semiconductor film is no higher than $7 \times 10^{19} cm^{-3}$ in accordance with the present invention, potential barriers are substantially not formed. Such low oxygen density can be realized by carrying out deposition of oxide films and semiconductor films in separate chambers provided for exclusive use in depositing the respective films. The oxygen density can be further decreased by evacuating the inside of the chamber to a very high vacuum condition, in advance of deposition, by means of combination of a turbo molecular pump and a cryosorption pump. Because of this, the mobility (field mobility) of electron in the semiconductors formed in accordance with the present invention is improved as high as 50 to 300 $cm^2/V \cdot S$.

Furthermore, the semiconductor deposited by sputtering is so fine as not to allow oxidation to reach to the inside of the film and only a very thin oxide films are formed at the surface thereof while the semiconductor deposited by plasma CVD includes a relatively high proportion of its amorphous phase along which oxidation proceeds into the inside of the semiconductor. This fine structure of the present invention helps to reduce interfacial barriers between crystals in association with lattice distortion.

The atmosphere in which sputtering for deposition of the semiconductor film is carried out may be hydrogen, a mixture of hydrogen and an inert gas such as Ar and He, or a hydrogen compound which does not change the property of the semiconductor film such as $SiH_4$ or $Si_2H_6$. Anyway, the density of hydrogen in the atmosphere is important to introduce appropriate hydrogen into the semiconductor film and cause sufficient lattice distortion therein. In the case of hydrogen/argon mixtures, the hydrogen proportion is selected between 5% and 100% (therefore the argon proportion between 95% and 0%), typically between 10% and 99% (argon between 1% and 90%), desirably between 25% and 95% (argon between 75% and 5%).

In accordance with preferred embodiments, an oxide film forming a gate insulating film and a semiconductor film forming a channel region are deposited successively so that the electrical characteristics of the gate insulated field effect transistor formed from the films become stable without being influenced from external disturbances. Of course, the present invention can be applied to a variety of other type transistors such as staggered types, coplanar types, inverted staggered types, inverted coplanar types.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1:
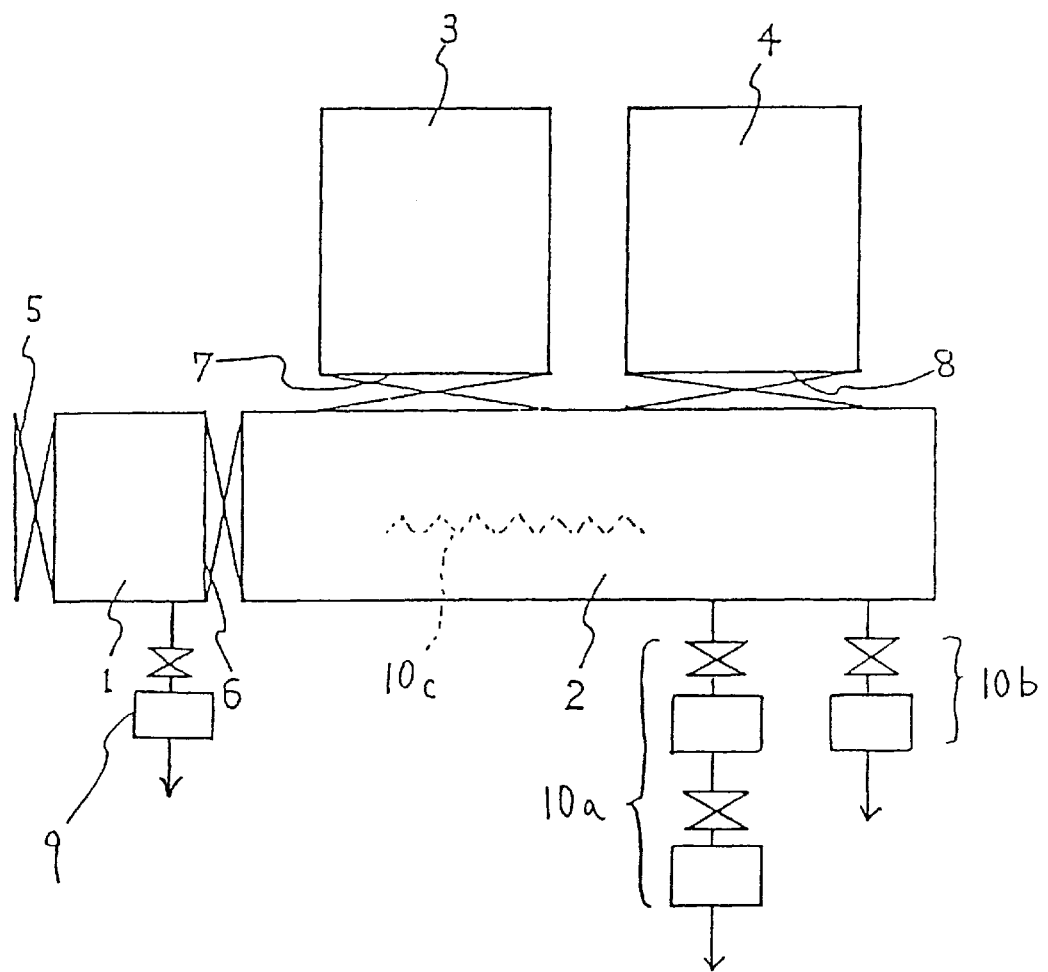
FIG. 1 is a schematic view showing a system for manufacturing thin film field effect semiconductor transistors in accordance with a first embodiment of the present invention.

Referring now to FIG. 1, FIGS. 2(A) and 2(B) and FIGS. 3(A) to 3(D), a method of manufacturing gate insulated field effect transistors will be explained. FIG. 1 is a schematic view showing multi-chamber sputtering system for depositing semiconductor and gate insulation films by magnetron RF sputtering in accordance with a first embodiment of the present invention. The system comprises a loading and unloading pre-chamber 1 provided with a gate valve 5, a subsidiary chamber 2 connected to the pre-chamber 1 through a valve 6 and first and second individual sputtering apparatuses 3 and 4 connected to the subsidiary chamber 2 respectively through valves 7 and 8. The pre-chamber 1 is provided with an evacuation system 9 comprising a rotary pump and a turbo molecular pump in series. The subsidiary chamber 2 is provided with a first evacuation system 10a for roughing comprising a rotary pump and a turbo molecular pump in series, a second evacuation system 10b for high vacuum evacuation comprising a cryosorption pump and a heater 10c located in the chamber 2 in order to heat substrates to be coated. If glass substrates to be coated are thermally contracted in advance by heating in the subsidiary chamber 2, thermal contraction and stress caused in films during deposition thereof on the glass substrate is reduced so that the adhesivity of the films can be improved.

Figure 2A:
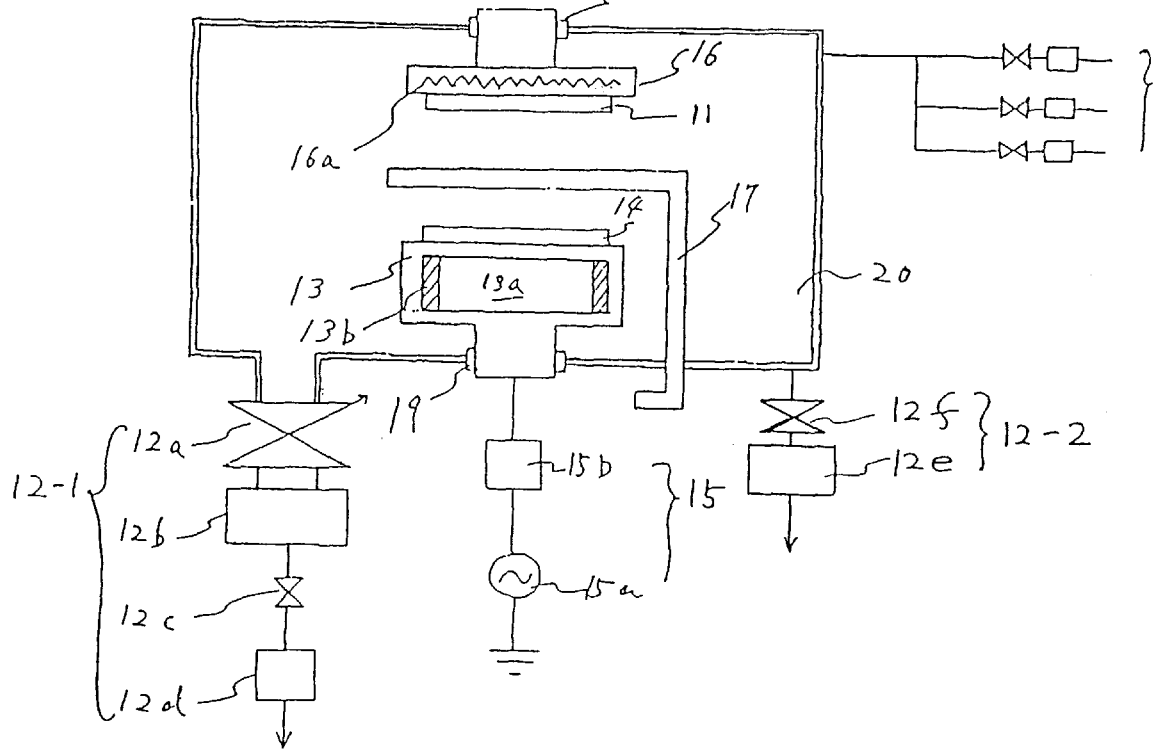
FIG. 2(A) is a schematic view showing a planar type magnetron RF sputtering apparatus of the system illustrated in FIG. 1 suitable for use in depositing oxide or semiconductor films.
Figure 2B:
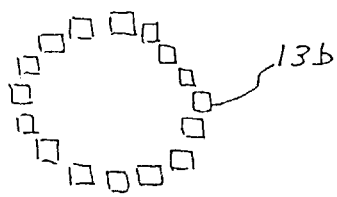
FIG. 2(B) is an explanatory view showing the arrangement of magnets provided in the apparatus as illustrated in FIG. 2(A).

The sputtering apparatuses 3 and 4 are individual planar type magnetron RF sputtering apparatuses suitable for exclusive use in depositing gate insulating films and semiconductor films respectively when used in accordance with the present invention. FIGS. 2(A) and 2(B) illustrate details of the RF sputtering apparatus. The apparatus comprises a vacuum chamber 20, a first evacuation system 12-1 for roughing consisting of a turbo molecular pump 12b and a rotary pump 12b respectively provided with valves 12a and 12c, a second evacuation system 12-2 for high vacuum evacuation comprising a cryosorption pump 12e provided with a valve 12f, a metallic holder 13 fixed in the lower side of the chamber 20 for supporting a target 14 thereon, formed with an inner conduit 13a through which a coolant can flow to cool the target 14 and provided with a number of magnets 13b such as electromagnets, an energy supply 15 consisting of an RF (e.g. 13.56 MHz) source 15a provided with a matching box 15b for supplying RF energy to the holder 13, a substrate holder 16 located in the upper position of the chamber 20 for supporting a substrate 11 to be coated, a heater 16a embedded in the substrate holder 16, a shutter 17 intervening the substrate 11 and the target 14 and a gas feeding system 18. Numeral 19 designates sealing means for ensuring airtight structure of the vacuum chamber 20. In advance of actual deposition on the substrate 11, impurities occurring in the targets are sputtered and deposited on the shutter 17 intervening the substrate 11 and the target 14, and then the shutter is removed in order to enable normal deposition on the substrate 11. The magnets 13b are oriented to have their N poles at the upper ends and S poles at the lower ends and horizontally arranged in a circle as illustrated in FIG. 2(B) in order to confine electrons in a sputtering region between the substrate 11 and the target 14.

Referring now to FIGS. 3(A) to 3(D) together with FIG. 1 and FIGS. 2(A) and 2(B), a method of manufacturing thin film field effect transistors in accordance with a first preferred embodiment of the invention will be described in details.

10 sheets of glass substrate are mounted on a cassette and placed in the loading and unloading pre-chamber 1 through the valve 5. After adjusting the inner conditions of the pre-chamber 1 and the subsidiary chamber 2 to each other, the cassette is transported from the pre-chamber 1 into the subsidiary chamber 2 through the valve 6. One of the glass substrates is disposed in the first magnetron RF sputtering apparatus as shown in FIG. 2(A) by means of a transportation mechanism (not shown) and coated with a $SiO_2$ film 32 therein to a thickness of 200nm in a 100% $O_2$ atmosphere (0.5 Pa) at a substrate temperature of 150° C. The output power of the apparatus is 400 W in terms of 13.56 MHz RF energy. An artificial quartz or a high purity silicon having a purity of 99.999% or more, for example a single crystalline silicon or a polycrystalline silicon, is used as a target. The coated substrate is then exchanged by another of the remaining 9 substrate which is subsequently coated with a $SiO_2$ film in the same manner. All the substrates mounted on the cassette are coated with a $SiO_2$ film by repeating this procedure. During this procedure, the transportation of a substrate between the prechamber 1 and the subsidiary chamber 2 has to be carried out after adjusting the pressures and the inner atmospheres of the chambers 1 and 2 to each other in order to eliminate undesirable impurities.

An amorphous silicon film 33 is next deposited in the second sputtering apparatus 4 on the $SiO_2$ film 32 to a thickness of 100 nm. The 10 substrates are placed into the apparatus 4 one after another from the subsidiary chamber 2 in the same manner and treated therein for deposition of the amorphous silicon film. The transportation of each substrate between the apparatus 4 and the subsidiary chamber 2 is carried out after adjusting the pressures and the inner atmospheres of the chamber 2 and 4 in order to eliminate undesirable impurities. This procedure is generally employed when it is desired to transport the substrates between the first or second sputtering apparatus and the subsidiary chamber, even if not particularly described hereinbelow. The atmosphere in the apparatus 4 comprises a mixture consisting of hydrogen and argon so that $H_2/(H_2+Ar)=0.8$ in terms of partial pressure. The hydrogen and argon gases have purities of 99.999 and 99.99 respectively and are introduced after the inside of the apparatus 4 is evacuated to $1\times10^{-7}$ Pa. The total pressure is 0.5 Pa: the output power of the apparatus is 400 w in terms of 13.56 MHz RF energy: a single crystalline silicon containing oxygen atoms at a concentration of no higher than $5\times10^{18}cm^{-3}$, e.g. $1\times10^{18}cm^{-3}$ is used as a target: and the substrate temperature is maintained at 150° C. (deposition temperature) by the heater 16a in the same manner. In preferred embodiments, the hydrogen proportion in the mixture may be chosen between 5% and 100%; the deposition temperature between 50° C. and 500° C.; the output power between 1 W and 10 MW in a frequency range from 500 Mz to 100 GHz which may be combined with another pulse energy source.

After all the substrates are coated with the silicon oxide and amorphous silicon semiconductor films, thermal treatment is given thereto in the subsidiary chamber 2 by means of the heater 10c at 450° C. to 700° C., typically at 600° C. for 10 hours in a hydrogen or an inert atmosphere, e.g. in 100% nitrogen by means of the heater. The film is recrystallized by this treatment (thermal annealing) in the form of semi-amorphous or semi-crystalline structure. In accordance with experiments, it was confirmed by SIMS (secondary ion mass spectroscopy analysis) that oxygen, carbon and hydrogen were involved respective at densities of $8\times10^{18}cm^{-3}$, $3\times10^{10}cm^{-3}$ and $4\times10^{20}cm^{-3}$ equivalent to one atom % assuming the density of silicon being $4\times10^{22}cm^{-3}$. These figures of density were minimum valves of the respective elements which varied along the depth direction. The reason why these minimum values were employed is that a natural oxide existed at the surface of the semiconductor film. The evaluation of these densities should be made with reference to the oxygen density in the silicon target ($1\times10^{18}cm^{-3}$).

These impurity densities were not changed even after the recrystallization so that the oxygen density remained at $8\times10^{18}cm^{-3}$. The formation of silicon amorphous films was repeated for reference by introduction of $N_2O$ at 0.1 cc/sec and 1 cc/sec together with the reactive gas. As a result, the oxygen densities after recrystallization increased respectively to $1\times10^{20}cm^3$ and $4\times10^{20}cm^{-3}$. In these cases, the temperature during thermal annealing must be elevated beyond 700° C. or the time of thermal treatment must be increased by a factor of 5 for performing sufficient recrystallization. Such high temperatures can not be employed in practice because of the low softening temperature of glasses. Also, long process times are undesirable from the view point of mass-production. From these facts, it will be understood as the important feature of the present invention that the substrate temperature is limited to no higher than 700° C., typically no higher than 600° C. The recrystallization of amorphous silicon semiconductor films became impossible, however, when the thermal annealing was carried out at no higher than 450° C. or the oxygen density in the amorphous silicon semiconductor films reached $1\times10^{20}cm^{-3}$ or higher due to oxygen leakage into the system. Namely, the oxygen density in the semiconductor films and the temperature range of thermal annealing have to be no higher than $7\times10^{19}\text{cm}^{-3}$ and in the range of 450 to 700° C. respectively.

Figure 6:
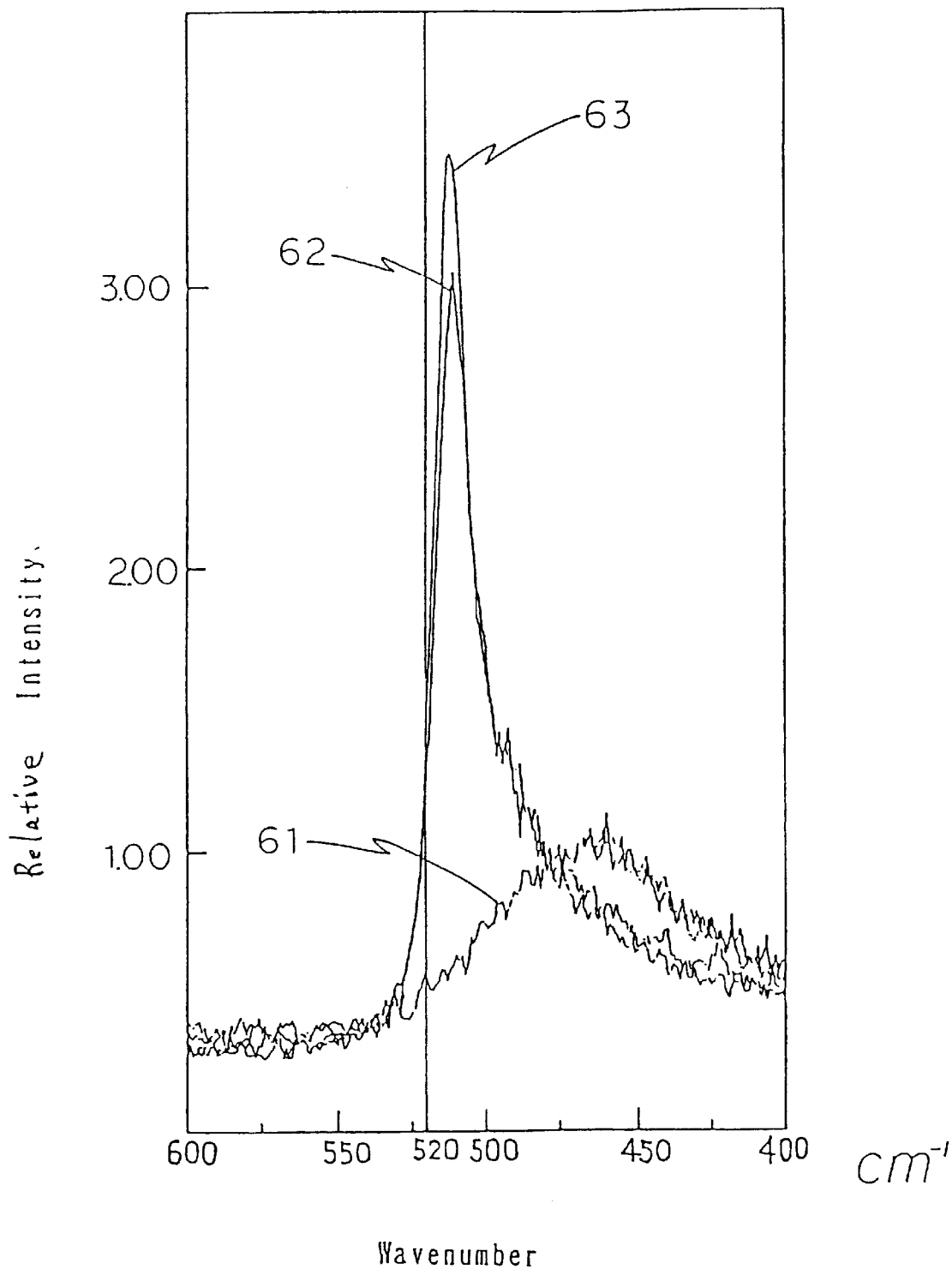
FIG. 6 is a graphical diagram showing Raman spectra of the semiconductor films deposited under several deposition conditions.

The impurities such as oxygen usually tend to be collected at interfaces between crystals and form interfacial barriers in the semiconductors. In the case of the semiconductor film formed according to the present invention, however, lattice distortion prevents the formation of barriers. The existence of lattice distortion was indicated by a shift in a peak of laser Raman spectra toward the lower frequency direction as shown in FIG. 6, which will be explained latter.

The substrates are then removed from the system. The semiconductor film of each substrate is etched in a suitable etching apparatus to produce a pattern necessary to form a number of transistors in accordance with the following procedure on the substrate 11. The film 33 shown in FIG. 3(A) corresponds to one of the transistors to be formed.

The substrates are placed in the manufacturing system again followed by hydrogen plasma cleaning of the surface of the semiconductor film 33 in the first sputtering apparatus 3. The entire structure is then coated with a 100 nm thick silicon oxide film 35 by sputtering in an oxide atmosphere as illustrated in FIG. 2(B). The atmosphere comprises a high density oxygen (95%) including $NF_3$ (5%) at a total pressure of 0.5 Pa: the output power of the apparatus is 400 W in terms of 13.56 MHz RF energy: an artificial quartz or a high purity silicon having a purity of 99.999% or more, for example a singly crystalline silicon or a polycrystalline silicon, is used as a target: and the substrate temperature is maintained at 100° C. The mixture of oxygen and $NF_3$ may be replaced by a mixture of an inert gas and oxygen. The surface level density can be reduced by increasing the proportion of oxygen to 100% (preferably pure oxygen) so as to realize excellent transistor characteristics. By this procedure, the silicon oxide film 35 to be a gate insulating film includes fluorine atoms which function to terminate dangling bonds of silicon atoms so that the formation of fixed charge can be prevented at the interface between the semiconductor film 33 and the oxide film 35. On the silicon oxide film 35 is deposited by low pressure CVD a silicon semiconductor film which is highly doped with phosphorus followed by photolithography with a suitable mask in order to form a gate electrode 40.

Figure 3A:
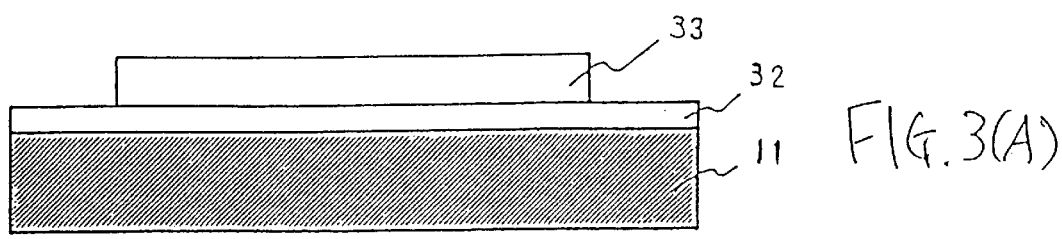
FIGS. 3(A) to 3(D) are cross sectional views showing a method of manufacturing thin film field effect semiconductor transistors in accordance with the first embodiment of the present invention.
Figure 3B:
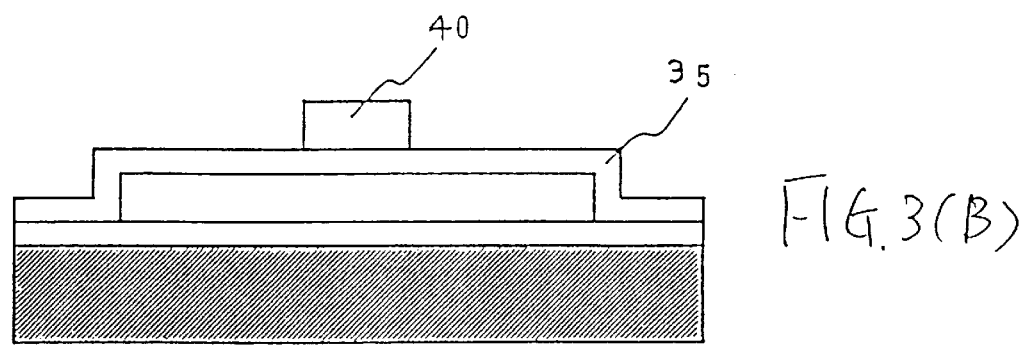
Figure 3C:
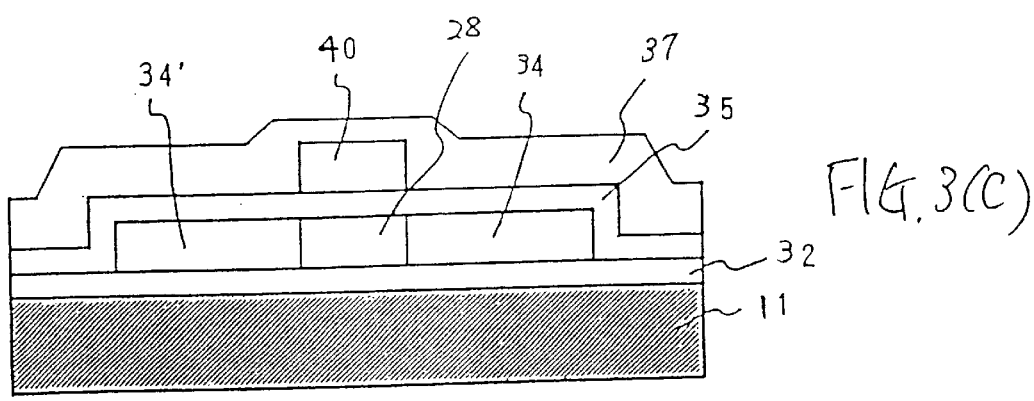
Figure 3D:
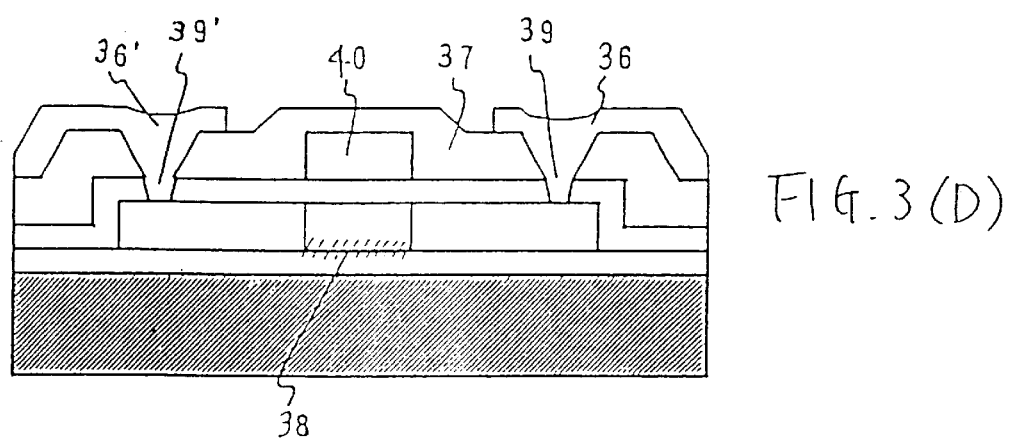

With the gate electrode 20 or the mask having used for forming it as a mask, self-aligned impurity regions, i.e. a source and a drain region 34 and 34' are formed by ion implantation. The intermediate region 28 of the silicon semiconductor film 33 between the impurity regions 34 and 34' is then defined as a channel region as illustrated in FIG. 3(C). The channel region is then thermally annealed at 100° C. to 500° C., for example 300° C., for 0.1 hour to 3 hours, for example 1 hour, in $H_2$ atmosphere. Then, the interface state density is not more than $2\times10^{11}\text{cm}^{-3}$. An interlayer insulation film 37 is coated over the entire surface of the structure followed by etching for opening contact holes through the interlayer film and the oxide film 35 in order to provide accesses to the underlying source and drain regions 34 and 34'. Finally, an aluminum film is deposited on the structure over the contact holes and patterned to form source and drain electrodes 36 and 36' as illustrated in FIG. 3(D). In accordance with this embodiment, since the source and drain regions and the channel region are formed in a same semiconductor film so that the process can be simplified and the carrier mobility in the source and drain regions is improved because of the crystality of the semiconductor film 33. Since the semiconductor film 33 is deposited on the underlying silicon oxide film 32 by sputtering, the bottom surface of the semiconductor film 33 is partially oxidized to form $SiO_x$ at the interface therebetween as designated by numeral 38. The $SiO_x$ functions to prevent formation of a back channel effect and reverse current leakage thereacross, and therefore is very effective and appropriate for manufacturing CMOSs.

Figure 4:
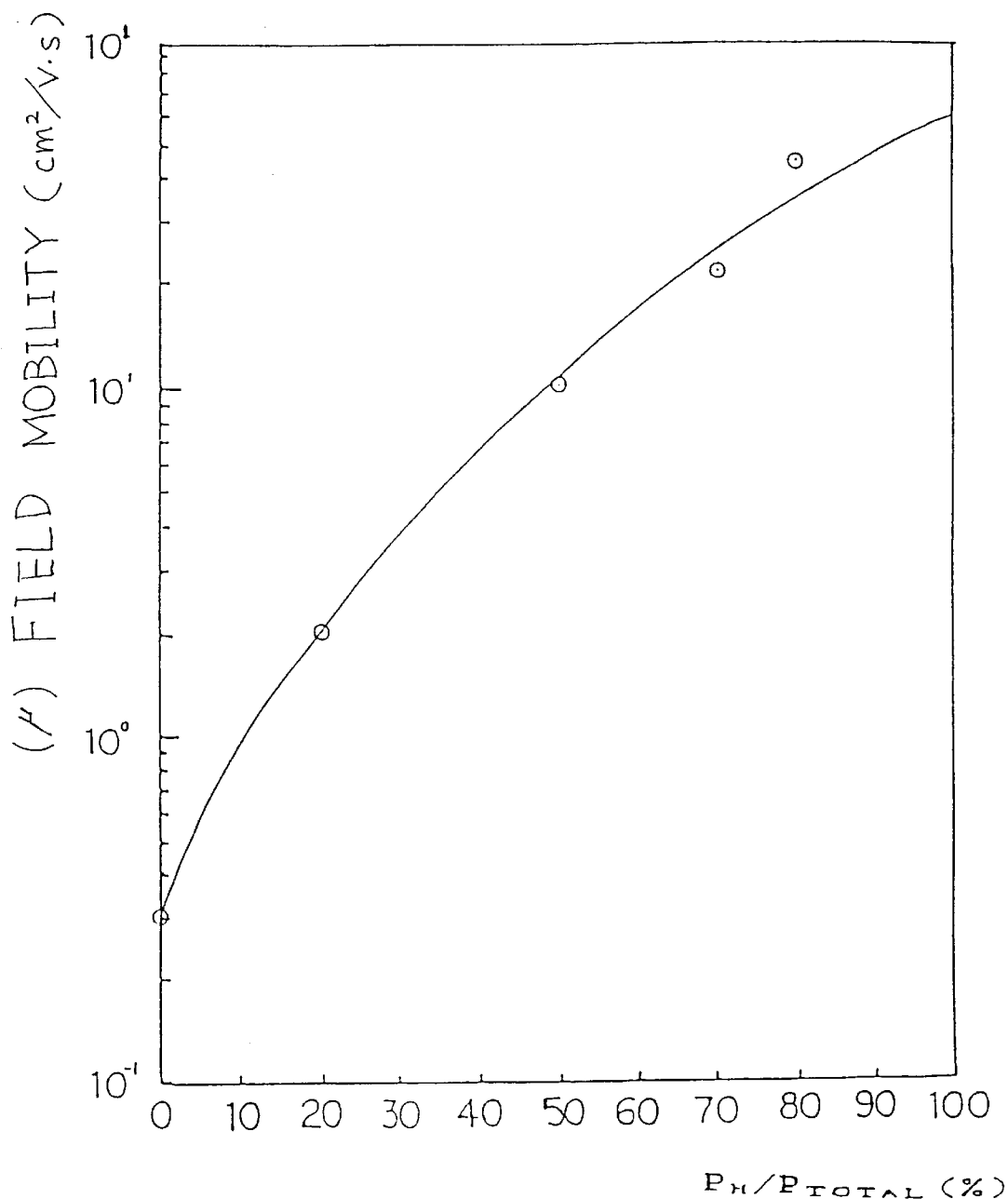
FIG. 4 is a graphical diagram showing the relationship between the partial pressure of hydrogen in the atmosphere in which semiconductor films are deposited and the field mobility of the semiconductor film.
Figure 5:
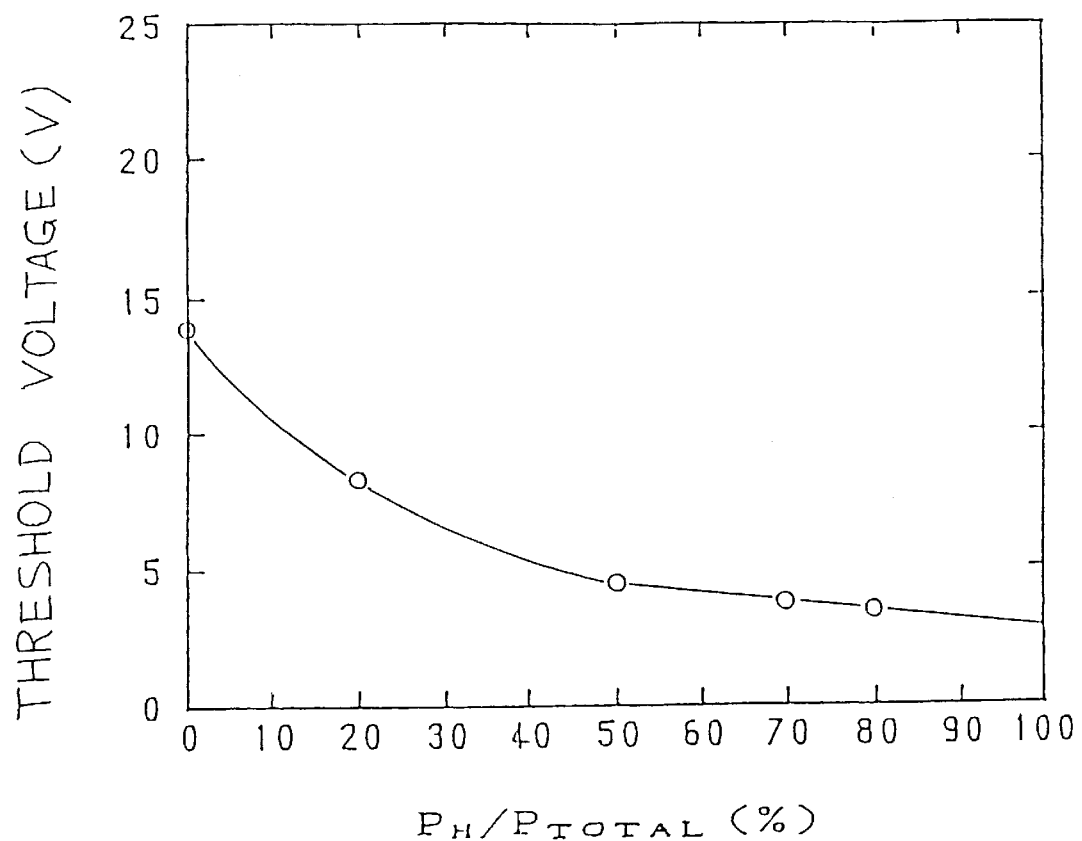
FIG. 5 is a graphical diagram showing the relationship between the partial pressure of hydrogen in the atmosphere in which semiconductor films are deposited and the threshold voltage of the transistor consisting of the semiconductor film.

The above procedure was repeated with changing the deposition condition of the semiconductor film 33 for reference. The proportion of hydrogen of the hydrogen/Ar mixture atmosphere was changed to be $H_2/(H_2+Ar)=0$, 0.2, 0.5, 0.7 and 0.8 respectively in term of partial pressure. The oxygen densities measured in these cases were $2\times10^{20}\text{cm}^{-3}$ (0), $7\times10^{19}\text{cm}^{-3}$ (0.2), $3\times10^{19}\text{cm}^{-3}$ (0.5), $1\times10^{19}\text{cm}^{-3}$ (0.7) and $8\times10^{-18}\text{cm}^{-3}$ (0.8). FIG. 4 is a graphical diagram showing the field mobility versus the proportion ($P_H \cdot P_{TOTAL}=H_2/(H_2+Ar)$) plotted using the transistors formed in the respective cases. In accordance with this diagram, higher values of the field mobility can be attained by higher $P_H/P_{TOTAL}$. The mobility ($\mu$) was as low as $3\times10^{-1}\text{cm}^2/\text{Vsec}$ when the hydrogen proportion was 0% since the oxygen density in the case is such a high value as $2\times10^{20}\text{cm}^{-3}$. The mobility was on the other hand limited to no lower than 2 $\text{cm}^2/\text{Vsec}$ if the hydrogen proportion was no lower than 20% (corresponding to oxygen densities not higher than $7\times10^{19}\text{cm}^{-3}$) as seen from the diagram. This can be considered partly because the introduction of hydrogen makes it possible to convert oxygen occurring in the deposition space to water which can be effectively removed from the deposition space by means of the cryosorption pump. FIG. 5 is a graphical diagram showing the threshold voltage versus the hydrogen proportion. As shown from this diagram, field effect transistors of normally off type can be formed to have threshold voltages of no higher than 8 V, which voltages are desirable from the practical view point, if the hydrogen proportion is no lower than 20%. Low threshold voltages correspond to low gate voltages of field effect transistors. This means that transistors having good characteristics can be formed by fabricating channel regions by depositing amorphous silicon film through sputtering carried out in a hydrogen atmosphere and giving the film by thermal treatment in accordance with the present invention at an appropriate hydrogen proportion. The electric characteristics tend to be improved as the hydrogen proportion is increased.

The proportion of hydrogen of the hydrogen/Ar mixture atmosphere in which the channel region was deposited was changed to be $H_2/(H_2+Ar)=0$, 0.2, and 0.5 respectively in term of partial pressure. FIG. 6 is a graphical diagram showing Raman spectra of the semiconductor film 33 plotted after the thermal treatment. The proportion of hydrogen of the hydrogen/Ar mixture atmosphere, i.e. $H_2/(H_2+Ar)$, were 0 (curve 61), 0.2 (curve 62) and 0.5 (curve 63) crystallinity in term of partial pressure. As shown in the diagram, the crystallinity was conspicuously enhanced when the hydrogen proportion was increased to 20% (curve 62) as compared with the case of 0% (curve 61). The average grain diameter of constituent crystals of the film in the case of 20% was 5 Å to 400 Å, typically 50 Å to 300 Å. The peak position of Raman spectra was shifted to the small wave number direction from the peak spectral position of singly crystalline silicon, i.e. $520\text{cm}^{-1}$, which shift apparently indicates existence of lattice distortion. The lattice distortion functions to lessen change in crystalline structure at the interfaces between constituent crystals so that each crystal can be more closely connected with neighbors and fewer impurity such as oxygen is collected at the interfaces, lowering the barrier height. As a result, high carrier mobilities can be realized.

The figures of grain diameters presented herein were calculated on the basis of Raman spectra measured by Raman spectra analysis. It is, however, not certain whether of not separate grains actually exist in the semiconductor films. Rather, definite grains do possible not exist so that the figures might be nominal. The nominal grain diameter can be controlled by adjusting the input RF power or the strength of magnetic fields applied to the substrate to be coated during deposition. The semiconductor can be deposited to have larger average grain diameters when larger electric current is supplied to the electromagnet 13b (FIG. 2(B)) in order to induce stronger magnetic fields. If the current is decreased, the grain diameter can be decreased.

Next, the mechanism of formation of semi-amorphous or semi-crystalline semiconductor material in accordance with the present invention will be explained. When sputtering a single crystalline silicon target in a mixture of hydrogen and argon, high energy heavy argon atoms collide with the surface of the target, dislodge therefrom clusters each consisting of several tens to several hundred thousands of silicon atoms, and deposit the clusters of a substrate to be coated. These clusters pass through the mixture gas in advance of the deposition on the substrate and are coupled with hydrogen atoms at their external surfaces in order to terminate their dangling bonds. Accordingly, when deposited on the substrate, the clusters comprise internal amorphous silicon and external ordered silicon including Si—H bonds. The Si—H bonds react with other Si—H bonds and are converted to Si—Si bonds by thermal treatment at 450° C. to 700° C. or radiation of a beam emitted from a light source, for example a laser, a halogen lamp, or the like in a non-oxidizing atmosphere. These coupling of adjacent silicon atoms (Si—Si) function to let adjacent clusters be attracted to each other whereas these clusters have a tendency to convert their phases to more ordered phases (partial recrystallization). As a result, the crystalline structure of these clusters is given lattice distortion and the peak of its Raman spectra is displaced to the low frequency direction.

The energy bands of the clusters are connected through the Si—Si bonds anchoring the clusters at the interfaces therebetween. For this reason, the polycrystalline (semi-amorphous or semi-crystalline) structure of silicon in accordance with the present invention is entirely different than usual polycrystals in which grain boundaries provide barriers against carrier transportation, so that the carrier mobility can be on the order of 10 to 200 $cm^2$/Vsec. Namely, the semi-amorphous or semi-crystalline structure in accordance with the present invention can be considered substantially not to include undesirable grain boundaries. Of course, if the semiconductor is subjected to high temperatures of 1000° C. or higher rather than the relatively low temperatures of 450° C. to 700° C., latent oxygen atoms come to appear at the boundaries between the clusters and form barriers like the prior art technique. The carrier mobility can be improved by increasing the strength of the anchoring. For this purpose, the oxygen density in the semiconductor film is decreased to $7 \times 10^{19} cm^{-3}$, desirably to $1 \times 10^{19} cm^{-3}$ so that recrystallization can be carried out at temperatures no higher than 600° C.

The following is date demonstrating the effects of the invention.

| $H_2$ proportion | S | VT | $\mu$ | on/off ratio |
| --- | --- | --- | --- | --- |
| 0 | 3.1 | 13.8 | 0.3 | 5.4 |
| 20 | 2.4 | 8.3 | 2.4 | 6.7 |
| 50 | 2.0 | 4.5 | 10.1 | 6.9 |
| 70 | 1.7 | 3.8 | 22.3 | 6.9 |
| 80 | 0.97 | 3.5 | 40.4 | 6.2 |

In the above date, $H_2$ proportion is the hydrogen on as discussed supra. S is the minimum value of $[d(ID)/d(VG)]^1$ of the drain current ID as a function of the gate voltage VG in the vicinity of origin. A smaller S indicates sharper rise of the VG–ID characteristic curve and better electric characteristics of the transistor. VT is the threshold voltage. The "$\mu$" is the carrier mobility in units of $cm^2$/V.s. The "on/off ratio" is the logarithm of the ratio of the drain current ID with VG being at 30V to the minimum value of the drain current ID when the drain voltage is fixed at 10V. From the date, it is understood as being preferred to choose a 80% or more proportion of hydrogen in the atmosphere.

Figure 8:
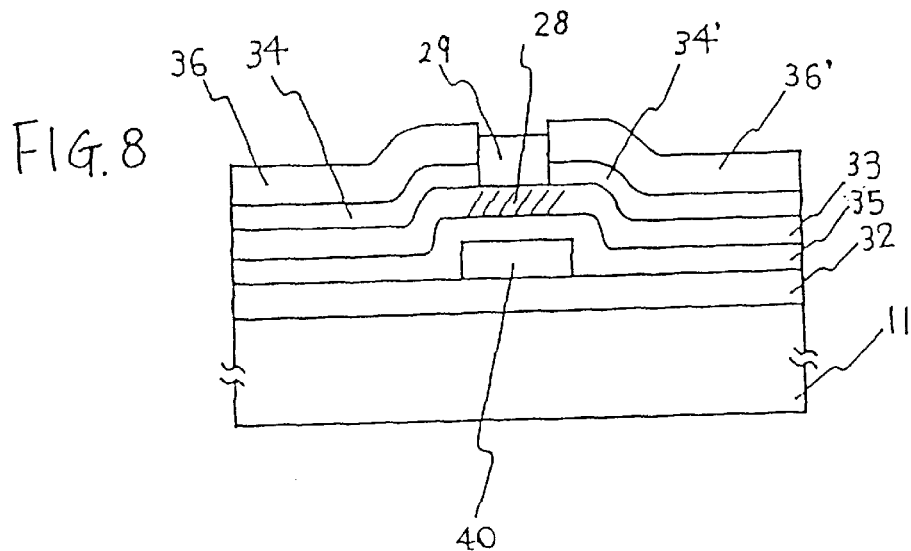
FIG. 8 is a cross sectional views showing a method of manufacturing thin film field effect semiconductor transistors in accordance with the second embodiment of the present invention.
Figure 7:
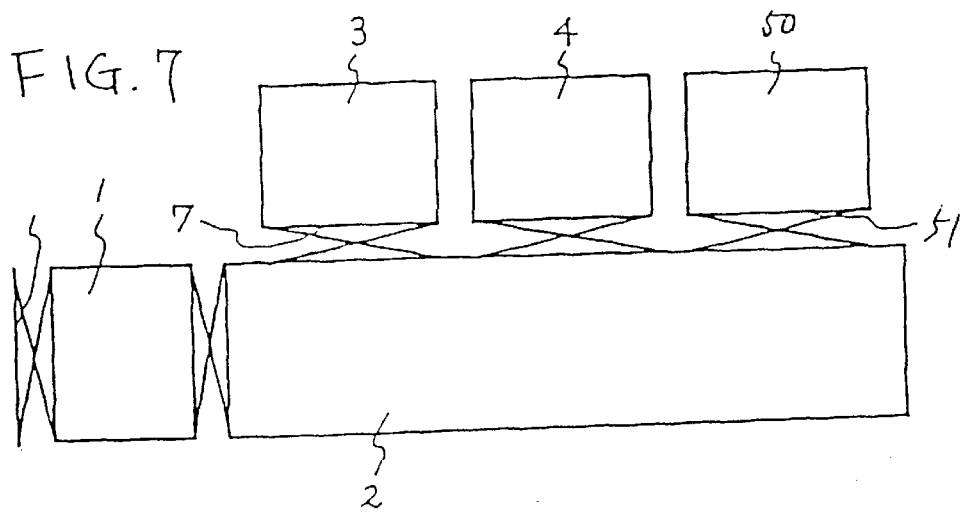
FIG. 7 is a schematic view showing a system for manufacturing thin film field effect semiconductor transistors in accordance with a second embodiment of the present invention.

Referring to FIG. 8, a method of manufacturing thin film field effect transistors in accordance with a second preferred embodiment of the present invention will be illustrated. This method is carried out be means of a system illustrated in FIG. 7 which is provided with an additional third sputtering apparatus 50 provided with a valve 51 as compared with FIG. 1. The other elements are substantially same as the corresponding elements illustrated in FIG. 1. The deposition of the insulating film 32 is carried out in the same manner as the first embodiment. Next, however, a gate electrode 40 is formed by depositing and patterning a molybdenum film of a thickness of 3000 Å unlike the procedure of the first embodiment.

The entire surface of the structure is then coated with a silicon oxide film 35 to a thickness of 100 nm by magnetron RF sputtering in the first sputtering apparatus 3. The atmosphere comprises a high density oxygen diluted with an inert gas, preferably, 100% oxygen at 0.5 Pa: the output power of the apparatus is 400 W in terms of 13.56 MHz RF energy; an artificial quartz or a high purity silicon, for example a singly crystalline silicon or a polycrystalline silicon, having a purity of 99.999% or more is used as a target: and the substrate temperature is maintained at 100° C. When pure oxygen (100% oxygen) is used as the atmosphere, the surface level density of the gate insulating film can be decreased so that excellent transistor characteristics are realized.

An amorphous silicon film 33 is deposited on the silicon oxide film 35 to a thickness of 100 nm in second sputtering apparatus 4. The atmosphere comprises a mixture consisting of hydrogen and argon so that $H_2/(H_2+Ar)=0.8$ in term of partial pressure. The total pressure is 0.5 Pa: the output power of the apparatus is 400 W in terms of 13.56 MHz RF energy: a single crystalline silicon is used as a target: and the substrate temperature is maintained at 150° C. in the same manner. The amorphous silicon film is then given thermal treatment in the subsidiary chamber 2 at 450° C. to 700° C., typically at 600° C. for 10 hours in a hydrogen or an inert atmosphere, e.g. in 100% nitrogen. The film is recrystallized by this treatment to be polycrystalline. In accordance with experiments, it was confirmed by SIMS analysis that oxygen, carbon and hydrogen atoms were involved respectively at $1 \times 10^{19} cm^{-3}$, $4 \times 10^{18} cm^{-3}$ and no higher than 1%. These figures of density were minimum valves of the respective elements which varied along the depth direction. Thus, a channel region 28 is formed on the gate electrode 40 with the gate insulating film 35 inbetween.

Next, an n$^+$-type amorphous silicon semiconductor film is deposited on the film 33 in the third magnetron RF sputtering apparatus 50 to a thickness of 50 nm. The atmosphere comprises a mixture consisting of $H_2$ at 10% to 99%, e.g. 80%, Ar at 1% to 90%, e.g. 19% in terms of partial pressure. The total pressure is 0.5 Pa: the output power of the apparatus is 400 W in terms of 13,56 MHz RF energy: a single crystalline silicon doped with phosphorus is used as a target: and the temperature in the apparatus is maintained at 150° C. The entire surface of the structure is coated with an aluminum film. The aluminum film and the n$^+$-type film are patterned to form source and drain regions 34 and 34', and source and drain electrodes 36 and 36'. The channel region 28 is defined just below a gap between the source and the drain regions 34 and 34'. The gap is filled with an insulator 29 for protecting the channel region 28.

In accordance with the second embodiment, since the gate insulating film 35 is formed in advance of the formation of the semiconductor film 33 forming the channel 28, the interface between the insulating film 35 and the channel 28 is readily thermal annealed so that the density of surface levels can be decreased. The oxygen density in the semiconductor film 33 and the mobility were measured respectively to be $1\times10^{19} cm^{-3}$ and 40.8cm$^2$/Vsec.

Figure 9:
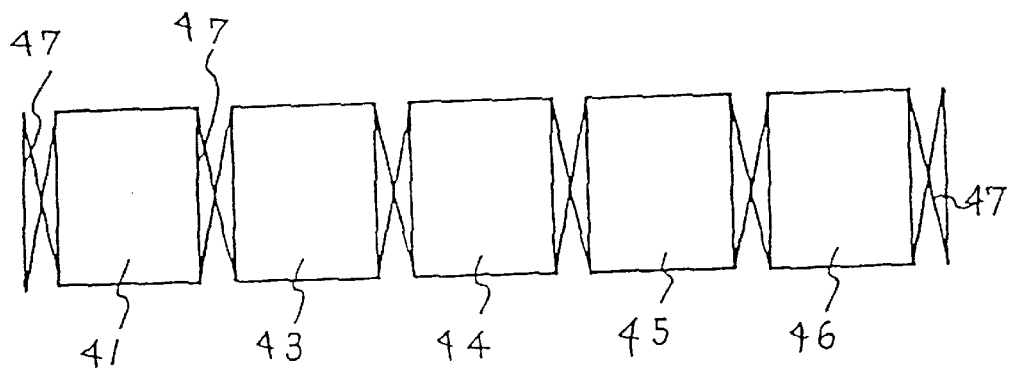
FIG. 9 is a schematic view showing a system for manufacturing thin film field effect semiconductor transistors in accordance with a third embodiment of the present invention.

Referring to FIG. 9 and FIGS. 10(A) to 10(E), a method of manufacturing gate insulated field effect transistors in accordance with a third embodiment of the present invention will be explained. FIG. 9 is a schematic view showing multi-chamber sputtering system for depositing semiconductor and oxide films by magnetron RF sputtering. The system comprises a loading prechamber 41, first, second and third individual sputtering apparatuses 43, 44 and 45 and an unloading chamber 46. These chambers and sputtering apparatuses are connected in series through gate valves 47 respectively. The structure of the loading pre-chamber 41 and the unloading chamber 46 are substantially same as the loading and unloading pre-chamber of the first embodiment and therefore description thereof will be dispensed with. Also, the structures of these sputtering apparatuses 43, 44 and 45 are same as illustrated in FIGS. 2(A) and 2(B) which have been explained in details in the above description.

The sputtering apparatuses 43 and 45 are individual planar type magnetron RF sputtering apparatuses devoted for exclusive use in depositing oxide films and the intermediate sputtering apparatus 44 for exclusive use in depositing semiconductor films respectively when used in accordance with this embodiment.

Referring now to FIGS. 10(A) to 10(E) together with FIG. 9, the procedure of manufacturing thin film field effect transistors in accordance with the third preferred embodiment of the invention will be described in details.

10 sheets of glass substrate are mounted on a cassette and placed in the loading pre-chamber 41 through the valve 47. After adjusting the inner conditions of the pre-chamber 41 and the first sputtering apparatus 43 to each other, one of the glass substrates is transported to and disposed in the first sputtering apparatus 43 as shown in FIG. 2(A) by means of a transportation mechanism (not shown) and coated with a $SiO_2$ film 32 therein to a thickness of 200 nm in a 100% $O_2$ atmosphere (0.5 Pa) at a substrate temperature of 150° C. The output power of the apparatus is 400 W in terms of 13.56 MHz RF energy. An artificial quartz or a high purity silicon, for example a single crystalline silicon or a poly-crystalline silicon, having a purity of 99.999% or more is used as a target. During deposition, a halogen may be introduced into the oxide film 32 if desired in order to effectively prevent alkali metal atoms from getting into the film from the glass substrate.

The coated substrate is then coated with an amorphous silicon film 33 in the second sputtering apparatus 44 on the $SiO_2$ film 32 to a thickness of 100 nm. The atmosphere in the apparatus 44 comprises a mixture consisting of hydrogen and argon so that $H_2/(H_2+Ar)=0.8$ in terms of partial pressure. The hydrogen and argon gases have purities of 99.999 and 99.99 respectively and are introduced after the inside of the apparatus 44 is evacuated to $1\times10^{-7}$ Pa. The total pressure is 0.5 Pa: the output power of the apparatus is 400 W in terms of 13.56 MHz RF energy: a single crystalline silicon containing oxygen atoms at a concentration of no higher than $5\times10^{18} cm^{-3}$, e.g. $1\times10^{18} cm^{-3}$ is used as a target: and the substrate temperature is maintained at 150° C. (deposition temperature) by the heater 16a in the same manner.

The substrates are then transported into the third sputtering apparatus 45 followed by hydrogen plasma cleaning of the surface of the semiconductor film 33 therein. The entire structure is then coated with a 100 nm thick silicon oxide film 35 in the third sputtering apparatus 45 in an oxide atmosphere. The atmosphere comprises a high density oxygen (95%) including $NF_3$ (5%) at a total pressure of 0.5 Pa: the output power of the apparatus is 400 W in terms of 13.56 MHz RF energy: an artificial quartz or a high purity silicon, for example a single crystalline silicon or a polycrystalline silicon, having a purity of 99.999% or more is used as a target: and the substrate temperature is maintained at 100° C. By this procedure, the silicon oxide film 35 to be a gate insulating film includes fluoride atoms which function to terminate dangling bonds of silicon atoms so that the formation of fixed charge can be prevented at the interface between the semiconductor film 33 and the oxide film 35.

The above explanation of the third embodiment has been carried out successively following the treatment of one substrate. The manufacturing process, however, is carried out in a pipeline fashion. Each sputtering apparatus receives a next substrate when a preceding substrate is coated and transported to the right-side sputtering apparatus or the unloading chamber 46, and carries out deposition on the next substrate concurrently with the other apparatuses unless deposition on all the 10 substrates has been finished. Needless to say, the transportation of each substrate between adjacent two of the loading chamber 41, the sputtering apparatuses 43, 44 and 45 and the unloading chamber 46 is carried out after adjusting the pressures and the inner atmospheres of the two in order not to eliminate undesirable impurities as explained in the foregoing embodiment.

After all the substrates are coated with the silicon oxide and amorphous silicon semiconductor film 32, 33 and 35 and collected in the unloading chamber 46, thermal treatment is given thereto in the unloading chamber 46 by means of a heater provided in the chamber at 450° C. to 700° C., typically at 600° C. for 10 hours in a hydrogen or an inert atmosphere, e.g. in 100% nitrogen by means of the heater. The semiconductor film 33 is recrystallized by this treatment (thermal annealing) into the form of semi-amorphous or semi-crystalline structure. In accordance with experiments, it was confirmed by SIMS that oxygen, carbon and hydrogen were involved respective at densities of $8\times10^{18} cm^{-3}$, $3\times10^{16} cm^{-3}$ and $4\times10^{20} cm^{-3}$ equivalent to one atom % assuming the density of silicon being $4\times10^{22} cm^{-3}$. These figures of density were minimum values of the respective elements which varied along the depth direction like the case of the first embodiment. The evaluation of these densities should be also made with reference to the oxygen density in the silicon target ($1\times10^{18}$cm$^{-3}$). The semiconductor film 33 may be recrystallized by radiating the film 33 with a beam emitted from a light source, for example a laser or halogen lamp.

These impurity densities were not changed even after the recrystallization so that the oxygen density remained at $8\times10^{18}$cm$^{-3}$. The formation of silicon amorphous films was repeated for reference by introduction of N$_2$O at 0.1 cc/sec and 1 cc/sec together with the reactive gas. As a result, the oxygen densities after recrystallization increased respectively to $1\times10^{20}$cm$^{-3}$ and $4\times10^{20}$cm$^{-3}$. In these cases, the temperature during thermal annealing must be elevated beyond 700° C. or the time of thermal treatment must be increased by a factor of 5 for performing sufficient recrystallization. Such high temperatures can not be employed in practice because of the low softening temperature of glasses. Also, long process times are undesirable from the view point of mass-production. From these facts, the importance of the present invention will be understood. The recrystallization of amorphous silicon semiconductor films became impossible. However, when the thermal annealing was carried out at no higher than 450° C. or the oxygen density in the amorphous silicon semiconductor films reached $1\times10^{20}$cm$^{-3}$ or higher due to oxygen leakage into the system. Namely, the oxygen density in the semiconductor films and the temperature range of thermal annealing have to be no higher than $7\times10^{19}$cm$^{-3}$ and in the range of 450 to 700° C. respectively. In the case of the semiconductor film formed according to the present invention, however, lattice distortion prevents the formation of barriers. The existence of lattice distortion was indicated by a shift in a peak of laser Raman spectra toward the lower frequency direction.

Figure 10A:
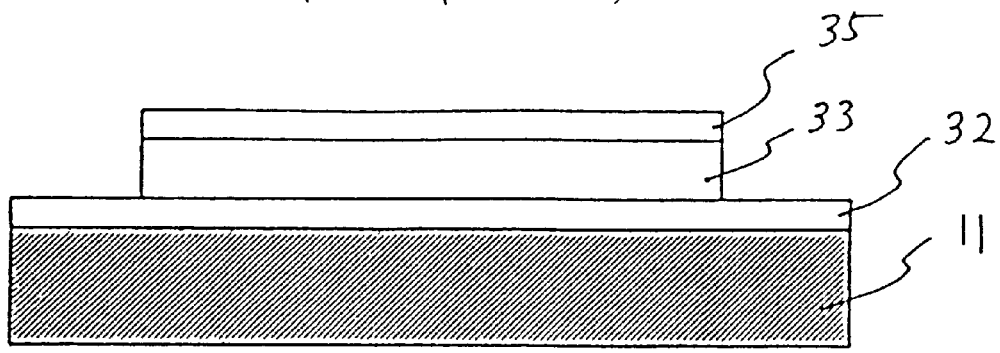
FIGS. 10(A) to 10(E) are cross sectional views showing a method of manufacturing thin film field effect semiconductor transistors in accordance with the third embodiment of the present invention.
Figure 10B:
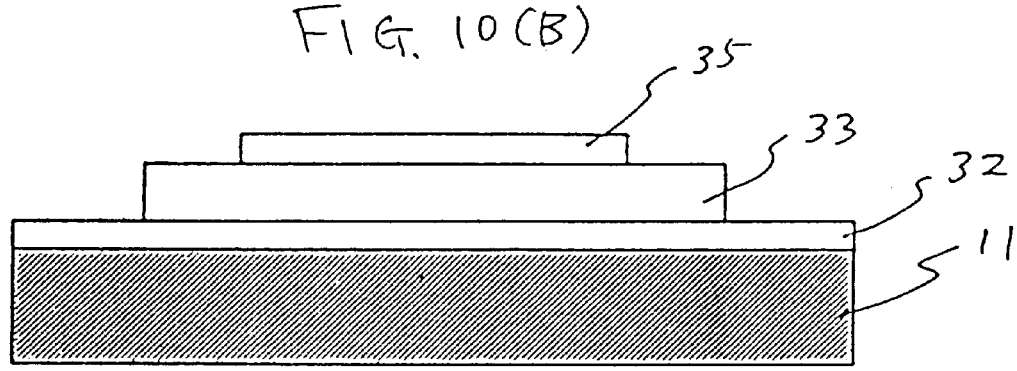
Figure 10C:
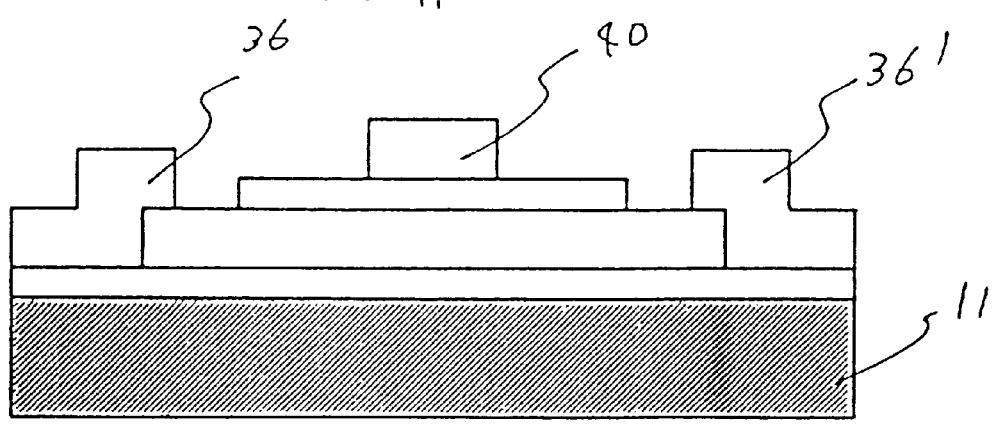

The substrates are then removed from the system. The oxide and semiconductor films 33 and 35 of each substrate are etched in a suitable etching apparatus to produce a pattern necessary to form a number of transistors in accordance with the following procedure on the substrate 11. The remaining films 33 and 35 shown in FIG. 10(A) corresponds to one of the transistors to be formed. The oxide film 35 is etched again in order to provide access to source and drain regions which will be formed within the semiconductor film 33 in latter steps. On the patterned structure is deposited by low pressure CVD a silicon semiconductor film which is highly doped with phosphorus followed by photolithography with a suitable mask in order to form a gate electrode 40 and source and drain electrodes 36 and 36' as illustrated in FIG. 10(C).

Figure 10D:
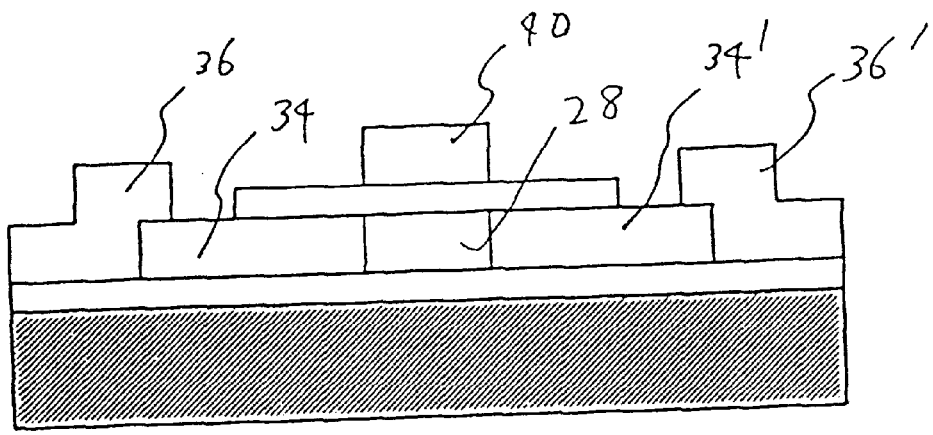
Figure 10E:
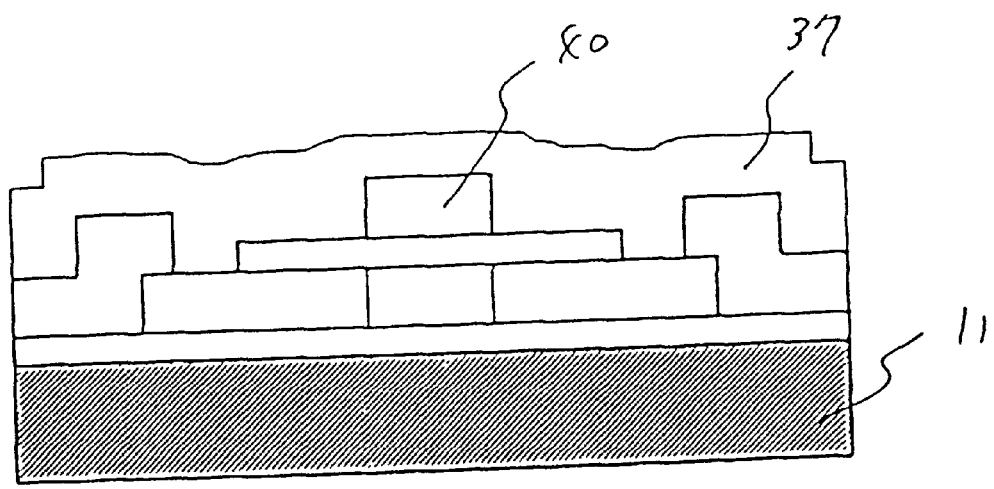

With the gate electrode 40 or the mask having used for forming it as a mask, self-aligned impurity regions, i.e. a source and a drain region 34 and 34' are formed by ion implantation followed by thermal annealing at 100° C. to 500° C., for example 300° C., for 0.1 hour to 3 hours, for example 1 hour, in a hydrogen atmosphere. Then, the intermediate region 28 of the silicon semiconductor film 33 between the impurity regions 34 and 34' is defined as a channel region as illustrated in FIG. 10(D) and the interface state density is not more than $2\times10^{11}$cm$^{-3}$. An insulating passivation film 37 is coated over the entire surface of the structure. In accordance with this embodiment, the throughput of manufacture can be substantially improved since all the sputtering apparatuses can operate in parallel.

Figure 11A:
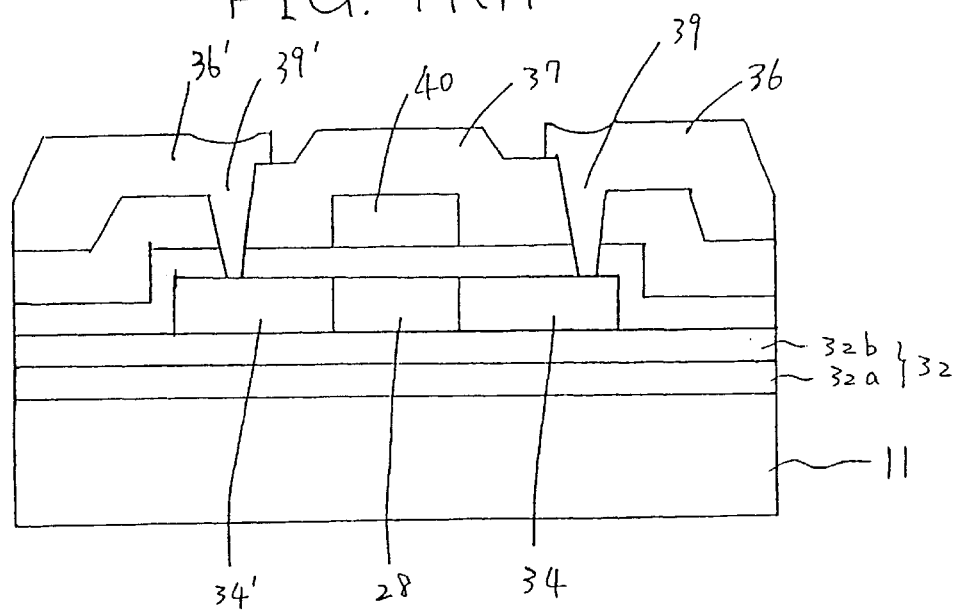
FIGS. 11(A) and 11(B) are cross sectional views showing thin film field effect transistors in accordance with the present invention.
Figure 11B:
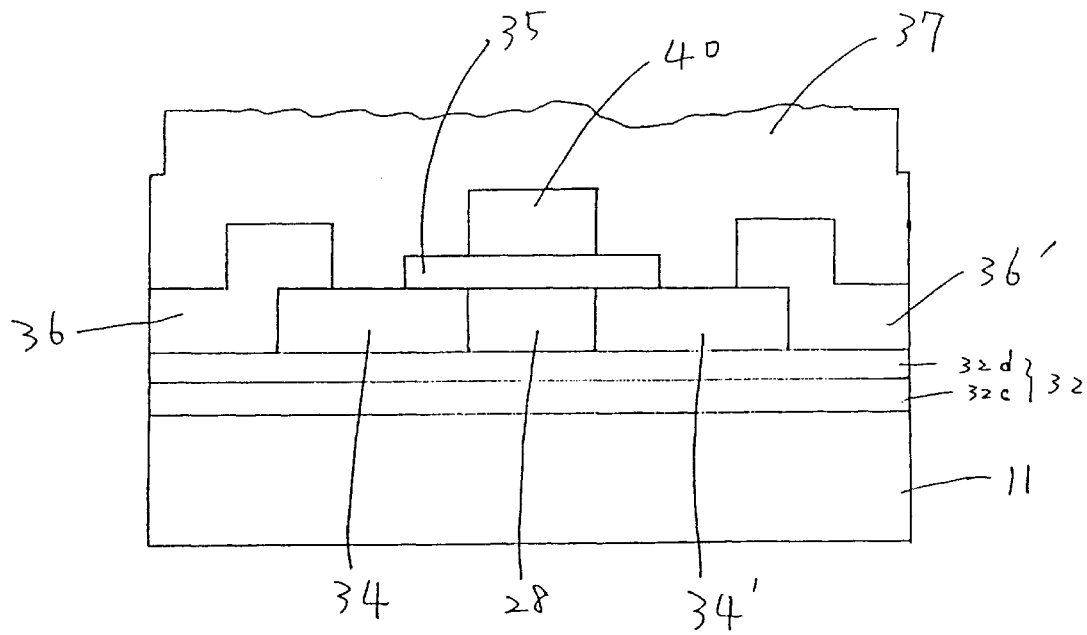

The foregoing description of preferred embodiments has been presented for purposes of illustration and description. It is not intended to be exhaustive or to limit the invention to the precise from described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Example are as follows:

The present invention can be applied to transistors utilizing other types of semiconductors such as germanium or silicon/germanium (Si$_x$Ge$_{1-x}$) semiconductors, in which case the thermal treatment can be done at temperatures approx. 100° C. lower than those used in the above embodiments. The deposition of such semiconductor can be carried out by sputtering in a high energy hydrogen plasma caused by optical energy (shorter than 1000 nm wavelength) or electron cyclotron resonance (ECR). In this case, positive ions can be effectively produced so that the formation of microstructure in the semiconductor film thus deposited is further prevented. Instead of gases including hydrogen molecules, some hydrogen compounds can be used as the atmosphere of sputtering as long as not to be impurity. For example, monosilane or disilane may be used for forming silicon semiconductor transistors. Although in the preferred embodiments, oxide and semiconductor films are deposited respectively in separate apparatuses, it is apparently also within the scope of this patent to deposit other types of gate insulating films or gate electrodes in a separate apparatus for exclusive use of depositing semiconductor films. Such gate electrode may be formed in the form of either a single layer or a multi-layer. In the case of the single layer, the gate electrode may be a silicon electrode doped with phosphorus or an aluminum electrode. In the case of the multi-layer, the gate electrode may be a two-layer electrode which consists of a lower chromium layer and an upper aluminum layer formed thereon or a two-layer electrode which consists of a lower silicon layer doped with phosphorus and an upper metallic or metal silicide layer formed thereon. The aluminum single layer electrode and the upper aluminum layer can be formed by sputtering an aluminum target. The silicon single layer electrode and the lower silicon layer can be formed by the low pressure CVD in accordance with the first preferred embodiment or by sputtering a silicon target doped with phosphorus. The lower chromium layer can be formed by sputtering a chromium target. The metallic layer may be a molybdenum layer formed by sputtering a molybdenum target, a wolfram layer formed by sputtering a wolfram target, a titanium layer formed by sputtering a titanium target, or an aluminum layer formed by sputtering an aluminum target. The metal silicide layer may be a MoSi$_2$ layer formed by sputtering a MoSi$_2$ target, a WSi$_2$ layer formed by sputtering a WSi$_2$ target, or a TiSi$_2$ layer formed by sputtering a TiSi$_2$ target. The metallic or metal silicide layer can be formed in the magnetron RF sputtering apparatus shown in FIG. 2(A). The formation of the metallic or metal silicide layer may be carried out in a pipeline fashion process for making gate insulated field effect transistors in a multi-chamber comprising individual sputtering apparatuses arranged in series. The formation of the silicon single layer electrode, the aluminum single layer electrode, the lower silicon layer, the lower chromium layer, and the upper aluminum layer may also be carried out in such a pipeline fashion process. In the pipeline fashion process, the upper metallic or metal silicide layer is formed in a sputtering apparatus different from a sputtering apparatus in which the lower silicon layer is formed and the upper metallic or metal silicide layer may be formed either before or after the formation of the lower silicon layer. In the pipeline fashion process, the upper aluminum layer is formed in a sputtering apparatus different from a sputtering apparatus in which the lower chromium layer is formed and the upper aluminum layer may be formed either before or after the formation of the lower chromium layer. In the preceding preferred embodiments a $SiO_2$ single-layer film is used as a gate insulating film, however, a $Si_3N_4$ single-layer film or a multi-layer film comprising a $SiO_2$ layer and a $Si_3N_4$ layer may be used as a formed in such a pipeline fashion process as described above. In the case of this multi-layer film, one of the $SiO_2$ layer and the $Si_3N_4$ layer is formed by sputtering in a sputtering apparatus and the other is formed by sputtering in another sputtering apparatus. The $Si_3N_4$ single-layer film and the $Si_3N_4$ layer can be formed by sputtering a $Si_3N_4$ target. The $SiO_2$ single-layer film can be formed by sputtering an artificial quartz target or a high purity silicon target, for example a single crystalline silicon target or a polycrystalline silicon target, having a purity of 99.999% or more. In place of the $SiO_2$ film 32 shown in FIG. 3(A) a $SiO_2$ film doped with phosphorus or a halogen element, for example fluorine, at a concentration in the range of $5 \times 10^{19}$ to $5 \times 10^{21} cm^{-3}$ may be deposited on a substrate in order to neutralize alkali ions, for example sodium ions, moved from the substrate into this film. The $SiO_2$ film doped with fluorine may be deposited on a substrate by sputtering an artificial quartz target or a high purity silicon target, for example a single crystalline silicon target or a polycrystalline silicon target, having a purity of 99.999% or more in an atmosphere comprising $NF_3$ gas and oxygen. The $SiO_2$ film doped with phosphorus may be deposited on a substrate by sputtering an artificial quartz target or a high purity silicon target, for example a single crystalline silicon target or a polycrystalline silicon target, having a purity of 99,999% or more in an atmosphere comprising $PH_3$ or $PF_3$ in addition to oxygen. The $SiO_2$ single-layer film doped with phosphorus or a halogen element may be used as a gate insulating film. Alternatively a multi-layer $SiO_2$ film 32 comprising a $SiO_2$ layer 32a doped with phosphorus or a halogen element and a non-dope $SiO_2$ layer 32b formed thereon as shown in FIG. 11(A) or a multi-layer $SiO_2$ film 32 comprising a non-dope $SiO_2$ layer 32c and a $SiO_2$ layer 32b doped with phosphorus or a halogen element and formed thereon as shown in FIG. 11(B) may be formed on a substrate 31. In the preceding description a thermal treatment is used to anneal an amorphous semiconductor film, however, an optical energy may be used to anneal an amorphous semiconductor film, however, an optical energy may be used to anneal an amorphous semiconductor film. In the first preferred embodiment it is indicated from FIG. 5 that the electric characteristics of the transistors whose semiconductor films 33 are obtained by depositing an amorphous semiconductor film by sputtering in an atmosphere comprising oxygen and argon and subsequently by thermal annealing the amorphous semiconductor film tend to be improved as the hydrogen proportion is increased. Also electric characteristics of transistors whose semiconductor films (channel regions) are obtained by depositing amorphous semiconductor films by sputtering in an atmosphere comprising a mixture of oxygen and argon and subsequently by optically annealing these amorphous semiconductor films (channel regions) by radiation of a beam emitted from a light source, for example a laser or a halogen lamp, tend to be improved as the hydrogen proportion of the mixture is increased.

What is claimed is:

1. A method of manufacturing a field effect transistor comprising the steps of:

forming a first insulating film over a substrate;

forming a semiconductor layer on said first insulating film successively without exposing said first insulating film to an air;

crystallizing said semiconductor layer;

cleaning a surface of said semiconductor layer with a hydrogen plasma; and then forming a gate insulating layer on said surface of the semiconductor layer.

2. The method of claim 1 wherein said gate insulating layer comprises silicon oxide.

3. A method of manufacturing a field effect transistor comprising the steps of:

forming a first insulating film over a substrate;

forming a semiconductor layer on said first insulating film without exposing said first insulating film to an air;

crystallizing said semiconductor layer;

cleaning a surface of said semiconductor layer with a hydrogen plasma; and then forming a gate insulating layer on said surface of the semiconductor layer, wherein the formation of said gate insulating layer is conducted without exposing the surface of said semiconductor layer after performing said cleaning.

4. The method of claim 3 wherein said gate insulating layer comprises silicon oxide.

5. A method of manufacturing a field effect transistor comprising the steps of:

forming a first insulating film by sputtering over a substrate;

forming an amorphous semiconductor layer on said first insulating film by sputtering without exosing said first insulating film to an air;

crystallizing said semiconductor layer;

cleaning a surface of said semiconductor layer with a hydrogen plasma; and then forming a gate insulating layer by sputtering after said cleaning step.

6. A method of manufacturing a field effect transistor comprising the steps of:

forming a first insulating film over a substrate;

forming a semiconductor layer comprising amorphous silicon on said first insulating film without exposing said first insulating film to an air;

crystallizing said semiconductor layer;

patterning the crystallized semiconductor layer into at least one semiconductor island;

performing a plasma cleaning on a surface of said semiconductor; and then forming a gate insulating film on said semiconductor island, and forming a gate electrode on said gate insulating film, wherein the formation of the gate insulating film is performed after the plasma cleaning without exposing the semiconductor island to air.

7. A method of manufacturing a field effect transistor according to claim 6 wherein said plasma comprises a hydrogen plasma.

8. A method of manufacturing a field effect transistor according to claim 6 wherein said plasma is induced by an r.f. power.

9. A method of manufacturing a field effect transistor comprising the steps of:

forming a first insulating film over a substrate;

forming a semiconductor layer on said first insulating film successively without exposing said first insulating film to air;

placing said substrate and semiconductor layer in an evacuable chamber;

performing a plasma cleaning on a surface of said semiconductor layer in said evacuable chamber; and successively forming a gate insulating film on said semiconductor layer in said evacuable chamber after the plasma cleaning.

10. A method of manufacturing a field effect transistor according to claim 9 wherein said semiconductor layer comprises silicon.

11. A method of manufacturing a field effect transistor according to claim 9 wherein said semiconductor layer comprises crystal silicon.

12. A method of manufacturing a field effect transistor according to claim 9 wherein said plasma comprises a hydrogen plasma.

13. A method of manufacturing a field effect transistor according to claim 9 wherein said plasma is induced by an r.f. power.

14. A method of manufacturing a field effect transistor according to claim 9 wherein said evacuable chamber is evacuated by an oil free pump.

15. A method according to claim 14 wherein said oil free pump is one of a turbo-molecular pump and a cryosorption pump.

16. A method of manufacturing a field effect transistor comprising the steps of:

forming a first insulating film over a substrate;

forming a semiconductor layer comprising amorphous silicon on said first insulating film without exposing said first insulating film to air;

crystallizing said semiconductor layer;

patterning the crystallized semiconductor layer into at least one semiconductor island;

performing a plasma cleaning on a surface of said semiconductor; and then forming a second insulating film on said semiconductor island, wherein the formation of the second insulating film is performed after the plasma cleaning without exposing the semiconductor island to air.

17. The method according to claim 1 wherein said gate insulating film is a multi-layer including a silicon oxide layer and a silicon nitride layer.

18. The method according to claim 3 wherein said gate insulating film is a multi-layer including a silicon oxide layer and a silicon nitride layer.

19. The method according to claim 5 wherein said gate insulating film is a multi-layer including a silicon oxide layer and a silicon nitride layer.

20. The method according to claim 6 wherein said gate insulating film is a multi-layer including a silicon oxide layer and a silicon nitride layer.

21. The method according to claim 9 wherein said gate insulating film is a multi-layer including a silicon oxide layer and a silicon nitride layer.

22. The method according to claim 16 wherein said gate insulating film is a multi-layer including a silicon oxide layer and a silicon nitride layer.

23. The method according to claim 1 wherein said semiconductor layer comprises silicon and germanium.

24. The method according to claim 3 wherein said semiconductor layer comprises silicon and germanium.

25. The method according to claim 5 wherein said semiconductor layer comprises silicon and germanium.

26. The method according to claim 6 wherein said semiconductor layer comprises silicon and germanium.

27. The method according to claim 9 wherein said semiconductor layer comprises silicon and germanium.

28. The method according to claim 16 wherein said semiconductor layer comprises silicon and germanium.

* * * * *